US012784842B2

(12) United States Patent
Balasubrahmanyam et al.

(10) Patent No.: US 12,784,842 B2
(45) Date of Patent: Nov. 3, 2026

(54) NAND DUTY CYCLE CORRECTION FOR DATA INPUT WRITE PATH

(71) Applicant: Intel NDTM US LLC, Santa Clara, CA (US)

(72) Inventors: Sriram Balasubrahmanyam, Folsom, CA (US); Tri Tran, Elk Grove, CA (US); Jong Tai Park, Pleasanton, CA (US); Priyanka Ravindran, San Jose, CA (US); Chuc Thanh, Davis, CA (US)

(73) Assignee: Intel NDTM US LLC, Santa Clara, CA (US)

( * ) Notice: Subject to any disclaimer, the term of this patent is extended or adjusted under 35 U.S.C. 154(b) by 57 days.

(21) Appl. No.: 18/084,100

(22) Filed: Dec. 19, 2022

(65) Prior Publication Data

US 2023/0118731 A1 Apr. 20, 2023

(51) Int. Cl.

| | |
|---|---|
| ***G11C 16/32*** | (2006.01) |
| ***G06F 3/06*** | (2006.01) |
| ***G11C 16/04*** | (2006.01) |
| ***G11C 16/10*** | (2006.01) |
| ***G11C 16/26*** | (2006.01) |
| ***H03K 3/017*** | (2006.01) |
| *G11C 29/02* | (2006.01) |

(52) U.S. Cl.

CPC .............. *G11C 16/32* (2013.01); *G06F 3/061* (2013.01); *G06F 3/0629* (2013.01); *G06F 3/0679* (2013.01); *G11C 16/0483* (2013.01); *G11C 16/10* (2013.01); *G11C 16/26* (2013.01); *H03K 3/017* (2013.01); *G11C 29/023* (2013.01)

(58) Field of Classification Search

CPC .................................................... G11C 29/023

See application file for complete search history.

(56) References Cited

U.S. PATENT DOCUMENTS 10,496,332 B2 12/2019 Srivastava et al.
2022/0392503 A1 * 12/2022 Chang .................. G11C 29/023

* cited by examiner

*Primary Examiner* — Jason Lappas

(74) *Attorney, Agent, or Firm* — Morgan, Lewis & Bockius LLP

(57) ABSTRACT

An example of an apparatus may include NAND memory and circuitry coupled to the NAND memory to provide duty cycle correction (DCC) for one or more write paths of the NAND memory. Other examples are disclosed and claimed.

20 Claims, 10 Drawing Sheets

NAND DUTY CYCLE CORRECTION FOR DATA INPUT WRITE PATH

BACKGROUND

Many electronic systems, such as computers, tablets, and cellular phones, include different devices. Examples of such devices include a host (e.g., a processor device), a memory device, and other integrated circuit (IC) device. The devices communicate with each other using signals (e.g., data signals and timing signals (e.g., strobe signals)). To improve accuracy in signals communicated between these devices, many conventional techniques are available for calibration of circuitry (e.g., receivers and transmitters) in these devices. In some conventional techniques, a device that includes an interface for communication with a host may include components that may operate during at least one of read link training and duty cycle distortion compensation operation.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
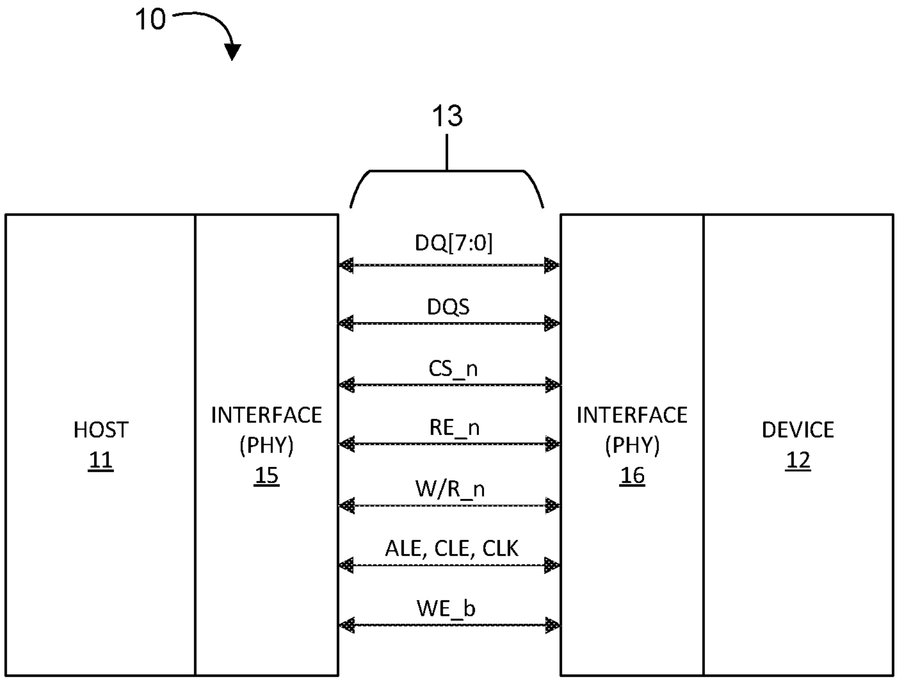
FIG. 1 shows an apparatus including a host, a device, and a channel between the host and device, according to some examples described herein.

One or more examples or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

While the following description sets forth various implementations that may be manifested in architectures such as system-on-a-chip (SoC) architectures for example, implementation of the techniques and/or arrangements described herein are not restricted to particular architectures and/or computing systems and may be implemented by any architecture and/or computing system for similar purposes. For instance, various architectures employing, for example, multiple integrated circuit (IC) chips and/or packages, and/or various computing devices and/or consumer electronic (CE) devices such as set top boxes, smartphones, etc., may implement the techniques and/or arrangements described herein. Further, while the following description may set forth numerous specific details such as logic implementations, types and interrelationships of system components, logic partitioning/integration choices, etc., claimed subject matter may be practiced without such specific details. In other instances, some material such as, for example, control structures and full software instruction sequences, may not be shown in detail in order not to obscure the material disclosed herein.

The material disclosed herein may be implemented in hardware, Field Programmable Gate Array (FPGA), firmware, driver, software, or any combination thereof. The material disclosed herein may also be implemented as instructions stored on a machine-readable medium, which may be read and executed by Moore Machine, Mealy Machine, and/or one or more processors. A machine-readable medium may include any medium and/or mechanism for storing or transmitting information in a form readable by a machine (e.g., a computing device). For example, a machine-readable medium may include read only memory (ROM); random access memory (RAM); Dynamic random-access memory (DRAM), magnetic disk storage media; optical storage media; nonvolatile (NV) memory devices; qubit solid-state quantum memory, electrical, optical, acoustical or other forms of propagated signals (e.g., carrier waves, infrared signals, digital signals, etc.), and others.

References in the specification to "one implementation", "an implementation", "an example implementation", etc., indicate that the implementation described may include a particular feature, structure, or characteristic, but every example may not necessarily include the particular feature, structure, or characteristic. Moreover, such phrases are not necessarily referring to the same implementation. Further, when a particular feature, structure, or characteristic is described in connection with an example, it is submitted that it is within the knowledge of one skilled in the art to effect such feature, structure, or characteristic in connection with other implementations whether or not explicitly described herein.

NV memory (NVM) may be a storage medium that does not require power to maintain the state of data stored by the medium. In one example, the memory device may include a three-dimensional (3D) NAND device. The memory device may refer to the die itself and/or to a packaged memory product. In particular examples, a memory component with non-volatile memory may comply with one or more standards promulgated by the JEDEC, or other suitable standard (the JEDEC standards cited herein are available at jedec.org).

Open NAND Flash Interface (ONFI) standards publishes various specifications (onfi.org/specifications) for a NAND memory device input/output interface (NAND interface) that includes communications between NAND flash memory device and other devices (e.g., a host, such as a processor device). Some NAND interfaces may run at a maximum speed up to 800 megatransfers per second (MT/s). Other host interfaces, such as Peripheral Component Interconnect Express (PCIe) and Universal Flash Storage version 3.0 (UFS 3.0) may benefit from a higher speed NAND interface in order to support a large storage capacity (e.g., up to 1.6 gigatransfers per second (GT/s) or higher).

Operating IO interfaces at a relatively high speed (e.g., up to 1.6 GT/s or higher) may suffer significant asynchronous clock (AC) timing margin loss due to channel losses, NAND internal variations (e.g., due to process, voltage, and temperature (PVT) and internal timing mismatches) and host-side losses (e.g., due to host-side DQ (data) and DQS (clock) mismatches). Some devices (e.g., NAND/interface chip/repeater/retimer devices) may utilize read link training technology to improve read system AC timing margin loss.

Operating IO interfaces in at a relatively high speed may also suffer significant duty cycle distortion (DCD) in the data output path related to timing margin loss due to the above-mentioned factors (e.g., channel losses, NAND internal PVT variations). Some devices may further include duty cycle correction (DCC) technology in the data output path to improve system DCD-related AC timing margin loss. An issue is that problematic duty cycle variations may also occur on a data input path. At very high speeds, another problem is that a valid data eye at a first internal flip flop on the data input path may be reduced. Another problem is that the operation bandwidth and margin on the read path may be limited. Some examples may overcome one or more of the foregoing problems.

Some examples may provide technology for DCC on a data input path. Some examples may share a duty cycle calibration engine among both the data output path and the data input path. Advantageously, some examples may increase a data valid window at the first internal flip flop and improve an input margin. Sharing the DCC calibration logic may advantageously reduce the design/area/verification effort while providing the gain in increasing the data valid window.

FIG. 1 shows an apparatus 10 including a host 11, a device 12, and a channel 13 between host 11 and device 12, according to some embodiments described herein. Host 11 may include or may be included in a processor (e.g., a general-purpose processor, or an application-specific integrated circuit (ASIC)), a computer (e.g., a server), a networking device, a computer storage system, or other electronic devices or systems. Device 12 may include a memory device (e.g., a flash memory device (e.g., NAND flash memory device)), an interface device (e.g., an interface chip), a repeater, a retimer, or other devices. Channel 13 may include conductive paths to carry signals that are communicated between host 11 and device 12. The conductive paths of channel 13 may include metal wires (e.g., metal traces on a circuit board). As shown in FIG. 1, host 11 and device 12 may include interfaces 15 and 16, respectively, coupled to channel 13. Each of interfaces 15 and 16 may include circuitry (e.g., physical layer (PHY) circuitry) to transmit and receive signals through channel 13.

Host 11 and device 12 may communicate with each other to exchange information (e.g., data, clock, and control information) in the form of signals. Examples of such signals include CE_b (chip enable signal), CLE (command latch enable), ALE (address latch enable), CLK (clock signal), WE_b (write enable), RE/RE_b (read enable), W/R_n (read/write direction), DQ (data signals), and DQS (strobe signals). In some implementations, the signals shown in FIG. 1 between host 11 and device 12 (e.g., and signals shown in other figures in this description) may be based on an ONFI specification. One skilled in the art would readily recognize that host 11 and device 12 may communicate with each using other signals (not shown). The device 12 may include any suitable read training circuitry and DCD compensation circuitry to improve AC timing margins on the data read output path. The device 12 may further include the technology described herein for DCC on the data write input path. In particular, the device 12 may include any of the devices described below with reference to FIG. 2 through FIG. 10D.

Figure 2:
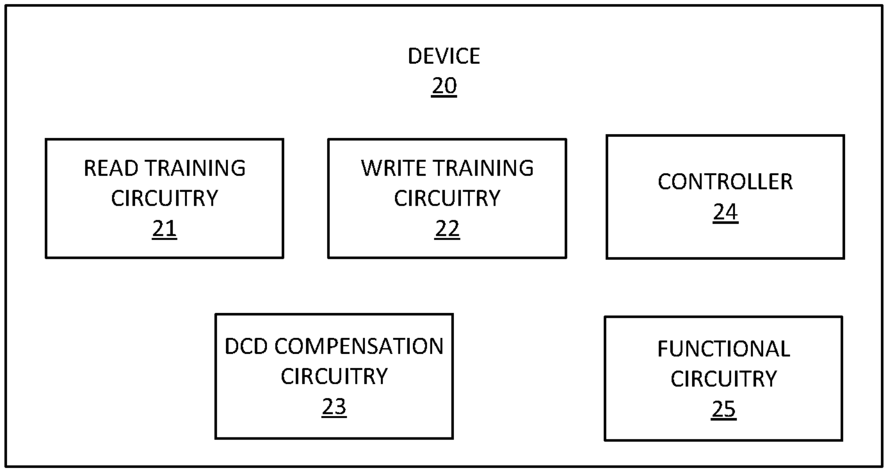
FIG. 2 shows a device including read training circuitry, write training circuitry, and duty cycle distortion (DCD) compensation circuitry, according to some examples described herein.

FIG. 2 shows an example of a device 20 including read training circuitry 21, write training circuitry 22, and DCD compensation circuitry 23. Device 20 may further include a controller 24 and functional circuitry 25 specific to the device 20. For example, the controller 24 and functional circuitry 25 may be configured to implement a memory device (e.g., a flash memory device, a NAND flash memory device, a 3D NAND memory device, etc.), an interface device (e.g., an interface chip), a repeater, a retimer, or other devices with high speed IO interfaces. Read training circuitry 21 may be any suitable circuitry configured to improve AC timing margins on a data read output path for the device 20. Write training circuitry 22 may include circuitry as described herein to improve AC timing margins on a data write input path for the device 20. The DCD compensation circuitry 23 may be utilized by both the read training circuitry 21 and the write training circuitry 22 to provide DCC for both the data read output path and the data write input path.

Figure 3:
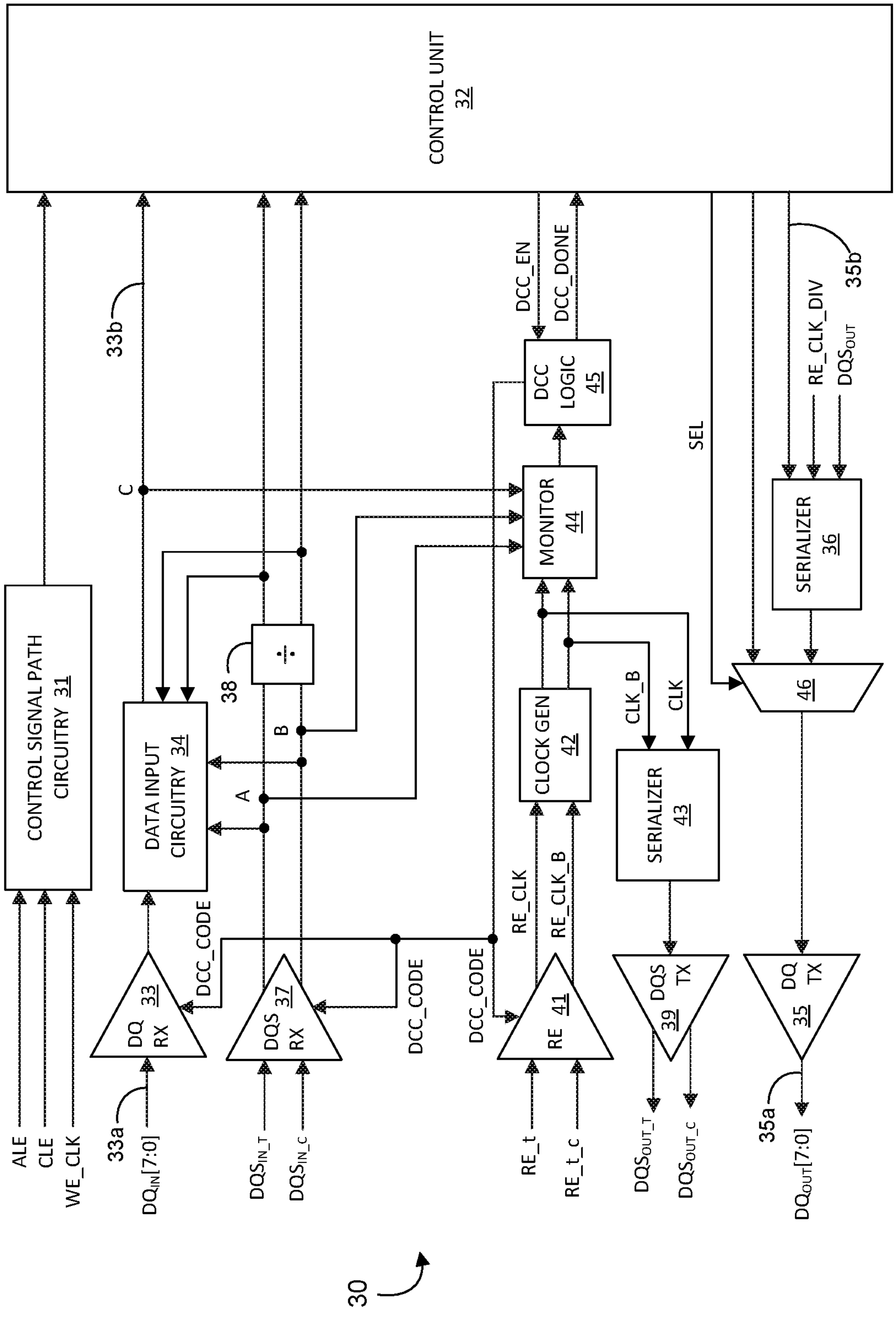
FIG. 3 shows another device including read training circuitry, write training circuitry, and duty cycle correction (DCC) circuitry, according to some examples described herein.

FIG. 3 shows a device 30 including read training circuitry, write training circuitry, and DCC circuitry, according to some examples described herein. As shown in FIG. 3, device 30 may receive signals that are similar to those described above with reference to FIG. 1, including signals CE_b, CLE, ALE, CLK, WE_b, RE/RE_b, W/R_n, DQin [7:0], DQout [7:0]. DQSin_t, and DQSin_c, DQSout_t, and DQSout_c. Signals DQin [7:0] and DQout [7:0] may be represented by signals DQ of FIG. 1. Signals DQSin_t, and DQSin_c, DQSout_t, and DQSout_c may be represented by signals DQS of FIG. 1.

As shown in FIG. 3, device 30 may include control signal path circuitry 31 (e.g., that may include components such as buffers and latches) to provide signals CE_b, ALE, CLE, and WE_b to control unit 32. Device 30 may perform IO operations (e.g., read, write, read link training, write link training, DCC calibration, etc.) based on timing (e.g., signal levels) of signals CE_b, CLE, ALE, CLK, WE_b, and RE/RE_b.

Device 30 may include DQ buffer (e.g., input data buffer (receiver (RX)) 33 to receive data signals (e.g., input data signals) DQin [7:0] from another device (e.g., host 11). Data signals DQin [7:0] may be provided to device 30 during a write operation of device 30. Device 30 may include input circuitry 34 to provide data signals DQin [7:0] (from DQ buffer 33) to control unit 32. Data signals DQin [7:0] may include eight bits (e.g., bit 0 through bit 7 (denotes as [7:0])) that may be provided concurrently (e.g., transferred in parallel) on paths (circuit paths) 33*a* and 33*b*. Thus, DQ buffer 33 may include eight separate receiver circuits to concurrently receive (e.g., receive in parallel) eight bits carried by (included in) signals DQin [7:0]. Input circuitry 34 may include a serial-in parallel-out (SIPO) circuit to receive signals DQin [7:0] from DQ buffer 33 and provide them to path 33*b*. Thus, each of paths 33*a* and 33*b* may include eight separate circuit paths to concurrently carry the bits (e.g., eight bits) of data signals DQin [7:0].

Device 30 may include DQ buffer (e.g., output data buffer (transmitter (TX))) 35 to provide data signals (e.g., output data signals) DQout [7:0] to another device (e.g., host 11). Data signals DQout [7:0] may be provided by device 30 during a read operation of device 30. Device 30 may include output circuitry to receive data signals DQout [7:0] (from internal components (e.g., memory circuit such as a first-in-first-out (FIFO) buffer)) and provide data signals DQout [7:0] to DQ buffer 35. Data signals DQout [7:0] may include eight bits (e.g., bit 0 through bit 7 (denoted as [7:0])) that may be provided concurrently (e.g., transferred in parallel) on paths (circuit paths) 35*a* and 35*b*. Thus, DQ buffer 35 may include eight separate receiver circuits to concurrently receive (e.g., receive in parallel) eight bits carried by (included in) signals DQout [7:0]. Output circuitry may include a serializer 36 (e.g., including a parallel-in serial-out (PISO) circuit) to receive signals DQout [7:0] on path 35*b* from internal components of device 30. Thus, each of paths 35*a* and 35*b* may include eight separate circuit paths to concurrently carry the bits (e.g., eight bits) of data signals DQout [7:0].

FIG. 3 shows each data signal DQin [7:0] and DQout [7:0] including eight bits (e.g., bit 0 through bit 7) as an example. However, the number of bits concurrently carried by data signals DQin [7:0] may vary, and the number of bits of concurrently carried by data signals DQout [7:0] may vary. For example, data signals DQin [7:0] may carry 16 bits in parallel, and data signals DQout [7:0] may carry 16 bits in parallel.

As shown in FIG. 3, device 30 may include DQS buffer (e.g., input strobe buffer (receiver (RX))) 37 to receive strobe signals (e.g., input strobe signals) DQSin_t and DQSin_c from another device (e.g., host 11). Strobe signals DQSin_t and DQSin_c may be true and complement signals (two separate clock signals). Strobe signals DQSin_t and DQSin_c may be provided to device 30 during a write operation. DQS buffer 37 may generate clock signals CLK and CLK_B that may have the same frequency as strobe signals DQSout_t and DQSout_c. Device 30 may receive data signals DQin [7:0] based on timing of clock signals CLK and CLK_B. Device 30 may include a divider (e.g., divided by four) 38 to divide clock signals CLK and CLK_B. Input circuitry 34 may use the divided clock signals (not shown) at the output of divider 38 to sample data signals DQin [7:0] and provide them to control unit 32.

Device 30 may include DQS buffer (e.g., strobe output buffer (transmitter (TX))) 39 to provide strobe signals (e.g., output strobe signals) DQSout_t and DQSout_c to another device (e.g., host 11). Strobe signals DQSout_t and DQSout_c may be true and complement signals (two separate clock signals). Strobe signals DQSout_t and DQSout_c may be provided by device 30 to another device (e.g., host 11) during a read operation. Another device (e.g., host 11) may receive data signals DQout [7:0] from device 30 on timing of strobe signals DQSout_t and DQSout_c.

DQ buffers 33 and 35 and DQS buffers 37 and 39 may be part of an interface (e.g., PHY) of device 30 to allow communication (e.g., transferring of signals) to and from device 30. The read training circuitry may include further suitable circuitry (not shown) such as read calibration logic, clock generators, pattern generators, etc. to support a read link training mode.

The device 30 further includes DCD compensation circuitry that may include RE buffer (e.g., input buffer (receiver (RX)) 41 to receive signals (complementary read enable signals) RE_t and RE_t_c and generate clock signals (complementary signals) RE_CLK and RE_CLK_B based on signals RE_t and RE_t_c. The DCD compensation circuitry may also include a clock generator 42 to generate clock signals (complementary signals) CLK and CLK_B based on signals RE_CLK and RE_CLK_B. Clock signals (complementary signals) CLK and CLK_B may be used to generate strobe signals DQSout_t and DQSout_c, respectively. For example, clock signals CLK and CLK_B may be provided to DQS buffer 39 through a serializer 43 and DQS buffer 39 may operate to provide signals (complementary signals) DQSout_t and DQSout_c based on clock signals CLK and CLK_B. Device 30 may send (e.g., send to host 101) data signals DQSOUT [7:0] and strobe signals DQSout_t and DQSout_c during a read operation of the device 30.

As shown in FIG. 3, the DCD compensation circuitry may include a monitor 44 and DCC logic 45 (e.g., logic circuitry). The control unit 32 that may operate to detect the levels of signals ALE and CLE that indicate a command (e.g., request by a host) has been issued to device 30 to cause device 30 to perform a DCC calibration operation. Based on the detection, control unit 32 may enable (e.g., by using information DCC_EN) DCC logic 45 to detect the toggling of signals RE_t and RE_t_c (e.g., by monitoring clock signals CLK and CLK_B) and begin part of the DCC calibration operation. DCC logic 45 may provide information DCC_DONE to control unit 32 when the DCC calibration operation is done.

Monitor 44 may operate to detect the toggling of signals RE_t and RE_t_c (e.g., by monitoring the levels of clock signals CLK and CLK_B). Monitor 44 may compare the average value (e.g., average voltage value) of clock signals CLK and CLK_B with a reference voltage. Because clock signals CLK and CLK_B are generated based on signals RE_CLK and RE_CLK_B, the average of clock signals CLK and CLK_B may also be the average of signals RE_CLK and RE_CLK_B. Further, because signals RE_CLK and RE_CLK_B are generated based on signals RE_t and RE_t_c, the average of signals RE_CLK and RE_CLK_B may also be the average of signals RE_t and RE_t_c. Thus, the average of clock signals CLK/CLK_B, the average of signals RE_CLK/RE_CLK_B, and the average of signals RE_t and RE_t_c may have the same relationship with a specific (e.g., predetermined) reference value. For example, the average of each of clock signals CLK/CLK_B, signals RE_CLK/RE_CLK_B, and signals RE_t and RE_t_c may be less than a reference value. In another example, the average of each of signals CLK/CLK_B, signals RE_CLK/RE_CLK_B, and signals RE_t and RE_t_c may be equal to a reference value. In a further example, the average each of clock signals CLK/CLK_B, signals RE_CLK/RE_CLK_B, and signals RE_t and RE_t_c may be greater than a reference value.

Monitor 44 may further operate to detect the toggling of signals DQSin_t and DQSin_t_c (e.g., by monitoring the levels of signals A and B output from the buffer 37). Monitor 44 may compare the average value (e.g., average voltage value) of signals A and B with a reference voltage. Because signals A and B are generated based on signals DQSin_t and DQSin_t_c, the average of monitored signals A and B may closely correspond to the average of signals DQSin_t and DQSin_t_c. Thus, the average of monitored signals A and B, and the average of signals DQSin_t and DQSin_t_c, may have the same relationship with a specific (e.g., predetermined) reference value. For example, the average of each of monitored signals A and B, and the average of signals DQSin_t and DQSin_t_c may be less than a reference value, may be equal to the reference value, and/or may be greater than the reference value.

Monitor 44 may further operate to detect the toggling of signals DQSin[7:0] (e.g., by monitoring the levels of signal C from the input circuitry 34). Monitor 44 may compare the average value (e.g., average voltage value) of signal C with a reference voltage. Because signal C is generated based on signals DQin[7:0], the average of monitored signal C may closely correspond to the average of signals DQin[7:0]. Thus, the average of monitored signal C, and the average of signals DQin[7:0], may have the same relationship with a specific (e.g., predetermined) reference value. For example, the average of each of monitored signal C and the average of signals DQin[7:0] may be less than a reference value, may be equal to the reference value, and/or may be greater than the reference value.

As shown in FIG. 3, the DCD compensation circuitry may include DCC logic (e.g., circuitry) 45 to control (e.g., adjust) the RE buffer 41, the DQ buffer 33, and the DQS buffer 37 based on the result of the comparison performed by monitor 44. As mentioned above, monitor 44 may compare the average values of the monitored signals with respective reference voltages and provide the result of the comparison. Based on the result of the comparisons, the DCC logic 45 may adjust the respective buffers to reduce or eliminate duty cycle distortion of the monitored signals CLK, CLK_B, A, B, and C so that the values of the monitored signals are within an acceptable duty cycle value (e.g., predetermined respective values). As an example, DCC logic 45 may adjust each of the RE buffer 41, the DQ buffer 33, and the DQS buffer 37 by providing different values for a code DCC-_CODE (a digital code that may include multiple bits) to decrease, hold (keep the same), or increase the frequency of the various signals (which are used to generate the monitored signals) until the monitor 44 determines (e.g., based on the result of the comparison) that the values (e.g., average values) of the monitored signals are within an acceptable duty cycle value.

In some examples, the device 30 may further include additional compensation circuitry (not shown) to adjust the frequency of a signal OSC (an internal oscillating) that may be internally generated by an internal oscillator (e.g., a local ring oscillator). The frequency of signal OSC may be set (e.g., programmed) to be N times (where N is a real number) the frequency of clock signals CLK and CLK_B (which is also N times the frequency of signals RE_t and RE_t_c). The additional compensation circuitry may include a frequency detector that may operate to determine (e.g., compare) the relationship between the frequency of clock signals CLK and CLK_B and frequency of signal OSC. The additional compensation circuitry may include a control circuit (which may include a finite state machine (FSM)) that may operate to control (e.g., adjust) the frequency of signal OSC based on the relationship between the frequency of clock signals CLK and CLK_B and frequency of signal OSC. For example, the control circuit may use different values of a code OSC_CODE (digital code) to control the internal oscillator in order to decrease, hold (keep the same), or increase the frequency of signal OSC, such that the frequency of signal OSC may be N times (e.g., a predetermined value) frequency of clock signals CLK and CLK_B.

In some examples, the device 30 may also include a multiplexer 46 that may respond to select information (e.g., signal) SEL to selectively provide output data DQout [7:0] to DQ buffer 35. Data signals DQout [7:0] may be either data signals DQ [0:7] from control unit 32 or serialized data signals from a serializer 36.

Figure 4:
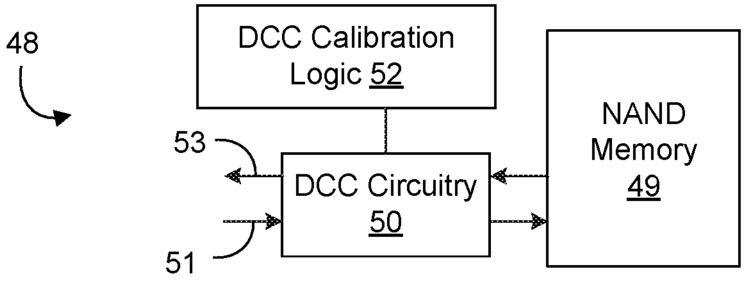
FIG. 4 is a block diagram of an apparatus according to an example.

With reference to FIG. 4, an example of an apparatus 48 may include NAND memory 49 and duty cycle correction (DCC) circuitry 50 coupled to the NAND memory 49 to provide DCC for one or more write paths 51 of the NAND memory 49. For example, the DCC circuitry 50 may be configured to provide closed loop DCC for one or more data input write paths 51 of the NAND memory 49. In some examples, the apparatus 48 may further include DCC calibration logic 52 coupled to the DCC circuitry 50 and the DCC circuitry 41 may be configured to adjust the DCC for one or more write paths 51 of the NAND memory 49 based on a first signal from the DCC calibration logic 52.

In some examples, the DCC circuitry 50 may be further configured to provide DCC for one or more read paths 53 of the NAND memory 49 and adjust the DCC for one or more read paths 53 of the NAND memory 49 based on a second signal from the DCC calibration logic 52. For example, the DCC calibration logic 52 may be configured to compare a signal pattern on a write path 51 of the NAND memory 49 against a reference pattern, determine a duty cycle comparison result based on the comparison, and provide a compensation code to the DCC circuitry 50 based on the duty cycle comparison result. In some examples, the DCC calibration logic 52 may be further configured to determine if the duty cycle comparison result indicates sufficient DCC for the write path 51 and, if so determined, lock the compensation code for the write path 51. In any of the examples herein, the NAND memory 49 may be 3D NAND memory.

The apparatus 48 may include or be communicatively coupled to one or more of a general purpose controller, a special purpose controller, a memory controller, a storage controller, a micro-controller, an execution unit, etc. In some examples, the NAND memory 49, the DCC circuitry 50, the DCC calibration logic 52, and/or other system memory may be located in, or co-located with, various components, including a controller (e.g., on a same die or package substrate). For example, the apparatus 48 may include a memory controller and be implemented as a connected memory device such as a memory module, a nonvolatile dual-inline memory module (NVDIMM), a solid-state drive (SSD), a memory node, etc.

Examples of a suitable controller and each of the above NAND memory 49, DCC circuitry 50, DCC calibration logic 52, and other apparatus components may be implemented in hardware, software, or any suitable combination thereof. For example, hardware implementations may include configurable logic, fixed-functionality logic, or any combination thereof. Examples of configurable logic include suitably configured programmable logic arrays (PLAs), FPGAs, complex programmable logic devices (CPLDs), and general purpose microprocessors. Examples of fixed-functionality logic include suitably configured application specific integrated circuits (ASICs), combinational logic circuits, and sequential logic circuits. The configurable or fixed-functionality logic may be implemented with complementary metal oxide semiconductor (CMOS) logic circuits, transistor-transistor logic (TTL) logic circuits, or other circuits.

For example, the DCC circuitry 50 may be implemented on a semiconductor apparatus, which may include one or more substrates, with the DCC circuitry 50 coupled to the one or more substrates. In some examples, the DCC circuitry 50 may be at least partly implemented in one or more of configurable logic and fixed-functionality hardware logic on semiconductor substrate(s) (e.g., silicon, sapphire, gallium-arsenide, etc.). For example, the DCC circuitry 50 may include a transistor array and/or other integrated circuit components coupled to the substrate(s) with transistor channel regions that are positioned within the substrate(s). The interface between the circuitry 46 and the substrate(s) may not be an abrupt junction. The DCC circuitry 50 may also be considered to include an epitaxial layer that is grown on an initial wafer of the substrate(s).

Alternatively, or additionally, all or portions of these components may be implemented in one or more modules as a set of logic instructions stored in a machine- or computer-readable storage medium such as RAM, ROM, programmable ROM (PROM), firmware, etc., to be executed by a processor or computing device. For example, computer program code to carry out the operations of the components may be written in any combination of one or more operating system (OS) applicable/appropriate programming languages, including an object-oriented programming language such as PYTHON, PERL, JAVA, SMALLTALK, C++, C#, VHDL, Verilog, System C or the like and conventional procedural programming languages, such as the "C" programming language or similar programming languages. For example, the NAND memory 49 other persistent storage media, or other system memory may store a set of instructions (e.g., which may be firmware instructions) which when executed by a controller cause the apparatus 48 to implement one or more components, features, or aspects of the apparatus 48 (e.g., providing DCC for one or more write paths of the NAND memory, adjusting the DCC for one or more write paths of the NAND, providing DCC calibration for the DCC, etc.).

Figure 5:
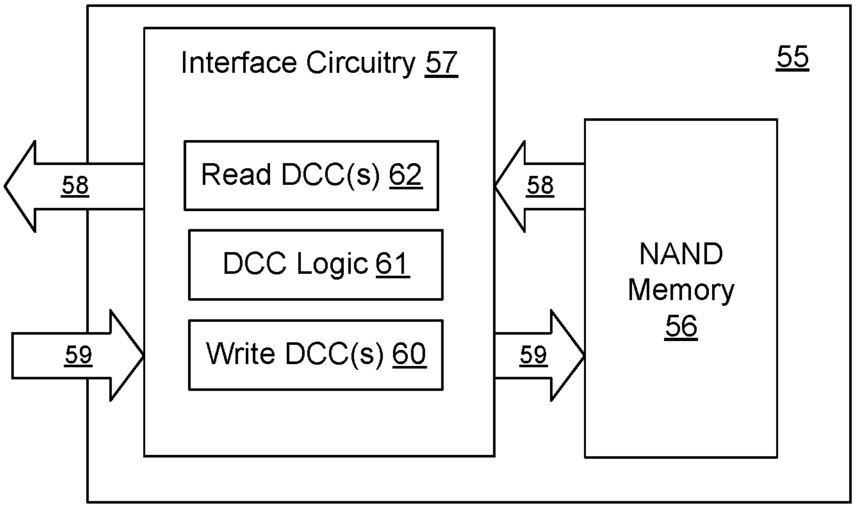
FIG. 5 is a block diagram of a memory device according to an example.

With reference to FIG. 5, an example of a memory device 55 may include NAND memory 56 (e.g., that may comprise 3D NAND memory) and interface circuitry 57 coupled to the NAND memory 56 to provide a plurality of output data read paths 58 and a plurality of input data write paths 59 for the NAND memory 56. The interface circuitry 57 may include a plurality of write DCC circuits 60 respectively coupled to the plurality of input data write paths 59 for the NAND memory 56 to provide DCC for the plurality of input data write paths 59. In some examples, the interface circuitry 57 may be further configured to train the plurality of write DCC circuits 60 in response to a request from a host. For example, in response to the request, the interface circuitry 57 may be configured to supply a reference clock pattern at an input of a write path 59 with a reference duty cycle, determine a duty cycle difference between the reference duty cycle and an output duty cycle of a signal pattern at an output of the write path 59, and adjust a corresponding write DCC circuit 60 coupled to the write path 59 to compensate for the duty cycle difference.

In some examples, the interface circuitry 57 may further include DCC logic 61 (e.g., including DCC calibration logic) coupled to the plurality of write DCC circuits 60 to provide a compensation code to the corresponding write DCC circuit 60 based on the duty cycle difference. For example, the DCC calibration logic 61 may be configured to provide one of a first compensation code if the duty cycle difference indicates that the output duty cycle is higher than the reference duty cycle and a second compensation code if the duty cycle difference indicates that the output duty cycle is lower than the reference duty cycle. In some examples, the corresponding write DCC circuit 60 may include a bleeder circuit to skew the input of the write path 59 based on the compensation code. In some examples, the interface circuitry 57 may further include a plurality of read DCC circuits 62 respectively coupled to the DCC calibration logic 61 and to the plurality of output data read paths 58 for the NAND memory 56 to provide DCC for the plurality of output data read paths 58 based on respective compensation codes from the DCC calibration logic 61.

The memory device 55 may include or be communicatively coupled to one or more of a general purpose controller, a special purpose controller, a memory controller, a storage controller, a micro-controller, an execution unit, etc. In some examples, the NAND memory 56, the interface circuitry 57, and/or other system memory may be located in, or co-located with, various components, including a controller (e.g., on a same die or package substrate). For example, the memory device 55 may include a memory controller and may be implemented as a connected memory device such as a memory module, a NVDIMM, an SSD, a memory node, etc.

Examples of each of the above NAND memory 56, interface circuitry 57, and other components of the memory device 55 may be implemented in hardware, software, or any suitable combination thereof. For example, hardware implementations may include configurable logic, fixed-functionality logic, or any combination thereof. Examples of configurable logic include suitably configured PLAs, FPGAs, CPLDs, and general purpose microprocessors. Examples of fixed-functionality logic include suitably configured ASICs, combinational logic circuits, and sequential logic circuits. The configurable or fixed-functionality logic may be implemented with CMOS logic circuits, TTL logic circuits, or other circuits.

For example, the interface circuitry 57 may be implemented on a semiconductor apparatus, which may include one or more substrates, with the interface circuitry 57 coupled to the one or more substrates. In some examples, the interface circuitry 57 may be at least partly implemented in one or more of configurable logic and fixed-functionality hardware logic on semiconductor substrate(s) (e.g., silicon, sapphire, gallium-arsenide, etc.). For example, the interface circuitry 57 may include a transistor array and/or other integrated circuit components coupled to the substrate(s) with transistor channel regions that are positioned within the substrate(s). The interface between the interface circuitry 57 and the substrate(s) may not be an abrupt junction. The interface circuitry 57 may also be considered to include an epitaxial layer that is grown on an initial wafer of the substrate(s).

Alternatively, or additionally, all or portions of these components may be implemented in one or more modules as a set of logic instructions stored in a machine- or computer-readable storage medium such as RAM, ROM, PROM, firmware, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C#, VHDL, Verilog, System C or the like and conventional procedural programming languages, such as the "C" programming language or similar programming languages. For example, the NAND memory 56, other persistent storage media, or other system memory may store a set of instructions (e.g., which may be firmware instructions) which when executed by a controller cause the memory device 55 to implement one or more components, features, or aspects of the memory device 55.

Figure 6:
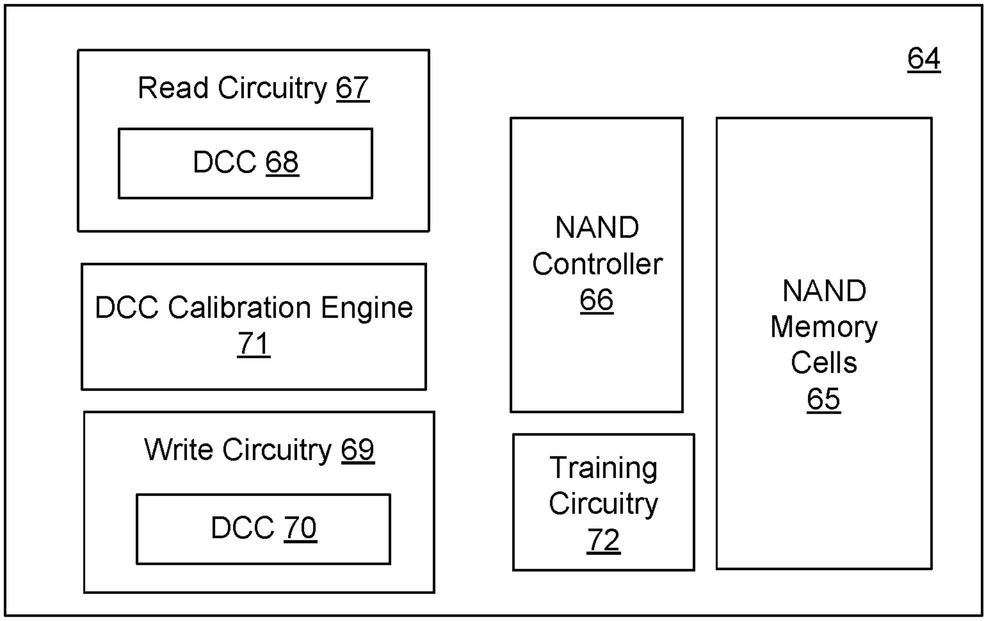
FIG. 6 is a block diagram of another memory device according to an example.

With reference to FIG. 6, an example of a memory device 64 may include NAND memory cells 65, a NAND controller 66 to control access to the NAND memory cells 65, read circuitry 67 including a read DCC circuit 68 to provide DCC for an output data read path for the memory device 64, and write circuitry 69 including a write DCC circuit 70 to provide DCC for an input data write path for the memory device 64. In some examples, the memory device 64 may further include a DCC calibration engine 71 shared between the read DCC circuit 68 and the write DCC circuit 70, and training circuitry 72 to, in response to a request from a host (e.g., a processor), supply a reference clock pattern at an input of the input data write path with a reference duty cycle, determine a duty cycle difference between the reference duty cycle and an output duty cycle of a signal pattern at an output of the output data write path, and adjust the write DCC circuit to compensate for the duty cycle difference based on information from the DCC calibration engine 71. For example, the DCC calibration engine 71 may be configured to provide a compensation code to the write DCC circuit 70 based on the duty cycle difference. In some examples, the DCC calibration engine 71 may be further configured to provide one of a first compensation code if the duty cycle difference indicates that the output duty cycle is higher than the reference duty cycle and a second compensation code if the duty cycle difference indicates that the output duty cycle is lower than the reference duty cycle. For example, the write DCC circuit 70 may include a bleeder circuit (e.g., as described in further detail herein) to skew the input of the input data write path based on the compensation code.

The memory device 64 may include or be communicatively coupled to one or more of a general purpose controller, a special purpose controller, a memory controller, a storage controller, a micro-controller, an execution unit, etc. In some examples, the NAND memory cells 65, the NAND controller 66, the read circuitry 67, the write circuitry 69, the engine 71, the training circuitry 72, and/or other system memory may be located in, or co-located with, various components, including a memory/storage controller (e.g., on a same die or package substrate). For example, the memory device 64 may include a memory controller and may be implemented as a connected memory device such as a memory module, a NVDIMM, an SSD, a memory node, etc. In some examples, the NAND memory cells 65 may comprise 6D NAND memory cells, such as floating gate NAND memory cells, charge trap flash (CTF) NAND memory cells. etc.

Examples of each of the above the NAND memory cells 65, the NAND controller 66, the read circuitry 67, the write circuitry 69, the engine 71, the training circuitry 72, and other components of the memory device 64 may be implemented in hardware, software, or any suitable combination thereof. For example, hardware implementations may include configurable logic, fixed-functionality logic, or any combination thereof. Examples of configurable logic include suitably configured PLAs, FPGAs, CPLDs, and general purpose microprocessors. Examples of fixed-functionality logic include suitably configured ASICs, combinational logic circuits, and sequential logic circuits. The configurable or fixed-functionality logic may be implemented with CMOS logic circuits, TTL logic circuits, or other circuits.

For example, the NAND controller 66, the read circuitry 67, the write circuitry 69, the engine 71, the training circuitry 72 may be implemented on a semiconductor apparatus, which may include one or more substrates, with the circuitry coupled to the one or more substrates. In some examples, the circuitry may be at least partly implemented in one or more of configurable logic and fixed-functionality hardware logic on semiconductor substrate(s) (e.g., silicon, sapphire, gallium-arsenide, etc.). For example, the circuitry may include a transistor array and/or other integrated circuit components coupled to the substrate(s) with transistor channel regions that are positioned within the substrate(s). The interface between the circuitry and the substrate(s) may not be an abrupt junction. The circuitry may also be considered to include an epitaxial layer that is grown on an initial wafer of the substrate(s).

Alternatively, or additionally, all or portions of these components may be implemented in one or more modules as a set of logic instructions stored in a machine- or computer-readable storage medium such as RAM, ROM, PROM, firmware, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C#, VHDL, Verilog, System C or the like and conventional procedural programming languages, such as the "C" programming language or similar programming languages. For example, the NAND memory cells 65, other persistent storage media, or other system memory may store a set of instructions (e.g., which may be firmware instructions) which when executed by a controller cause the memory device 64 to implement one or more components, features, or aspects of the memory device 64.

Figure 7:
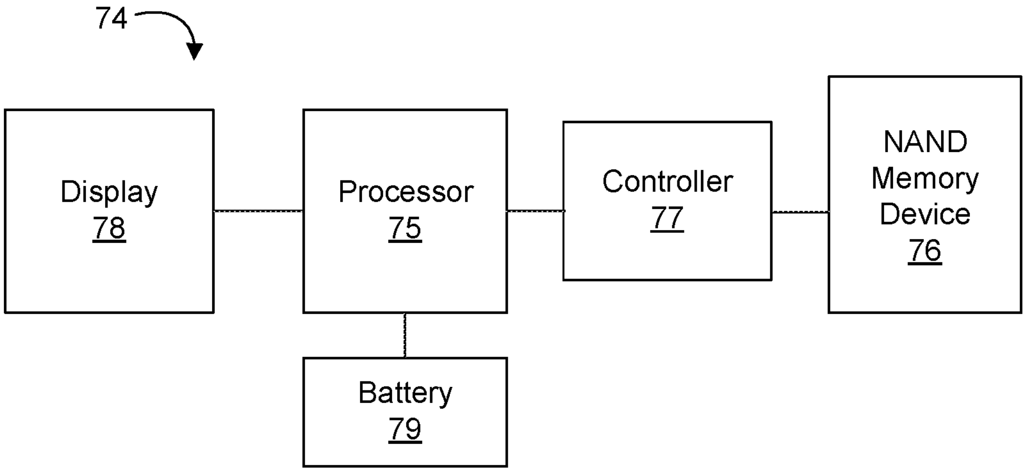
FIG. 7 is a block diagram of a system according to an example.

With reference to FIG. 7, an example of a system 74 may include a processor 75, a NAND memory device 76, and a controller 77 communicatively coupled to the processor 75 and the NAND memory device 76. For example, the NAND memory device 76 and/or the controller 77 may include one or more features or aspects of the examples described herein. In particular, the NAND memory device 76 may include one or more features or aspects of the apparatus 48 (FIG. 4), the memory device 55 (FIG. 5), and/or the memory device 64 (FIG. 6).

In some examples, the NAND memory device 76 may comprise 3D NAND memory cells, such as floating gate NAND memory cells, CTF NAND memory cells. etc. In some examples, the system 74 may comprise a mobile computing device and may include any of a number of connected devices, peripherals, and/or components, such as at least one of a display 78 communicatively coupled to the processor 75, and a battery 79 coupled to the processor 75, etc.

For example, the controller 77 may be configured as a memory controller. For example, the NAND memory device 76 may be a connected memory device (e.g., a memory module, NVDIMM, an SSD, a memory node, etc.). Examples of the circuitry of the controller 77 may be implemented in a system, apparatus, computer, device, etc., for example, such as those described herein. More particularly, hardware implementations may include configurable logic (e.g., suitably configured PLAs, FPGAs, CPLDs, general purpose microprocessors, etc.), fixed-functionality logic (e.g., suitably configured ASICs, combinational logic circuits, sequential logic circuits, etc.), or any combination thereof. Alternatively, or additionally, the circuitry of the controller 77 may be implemented in one or more modules as a set of logic instructions stored in a machine- or computer-readable storage medium such as RAM, ROM, PROM, firmware, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C#, VHDL, Verilog, System C or the like and conventional procedural programming languages, such as the "C" programming language or similar programming languages.

Some examples may provide technology for NAND closed loop DCC for a data input write path. At high clock speeds (e.g., 1.2 gigabits per second (Gbps) or greater), DCC may be beneficial for a read clock on a data output (DOUT) read path (e.g., a read true (RE_T) and/or a read complementary (RE_C) signal). Conventionally, however DCC has not been applied to a data input write path (e.g., a data (DQ) signal and/or a DQ strobe (DQS) signal). As clock speeds continue to increase (e.g., 2.4 Gbps and greater), the smaller unit interval (UI) may reduce a valid data eye at a first internal flop input in a conventional interface circuit. For example, in a conventional interface circuit, the data input valid window may be reduced due to duty cycle distortion (e.g., a data rise and fall delay mismatch). The operation bandwidth and margin on read path may also be limited in a conventional interface circuit. Some examples provide technology for DCC on DQ and DQS input paths, advantageously improving the valid data eye at the first internal flip flop. In some examples, an interface circuit may include DCC for the data input write path, advantageously increasing the data input valid window with rise and fall mismatch compensation.

Figure 8:
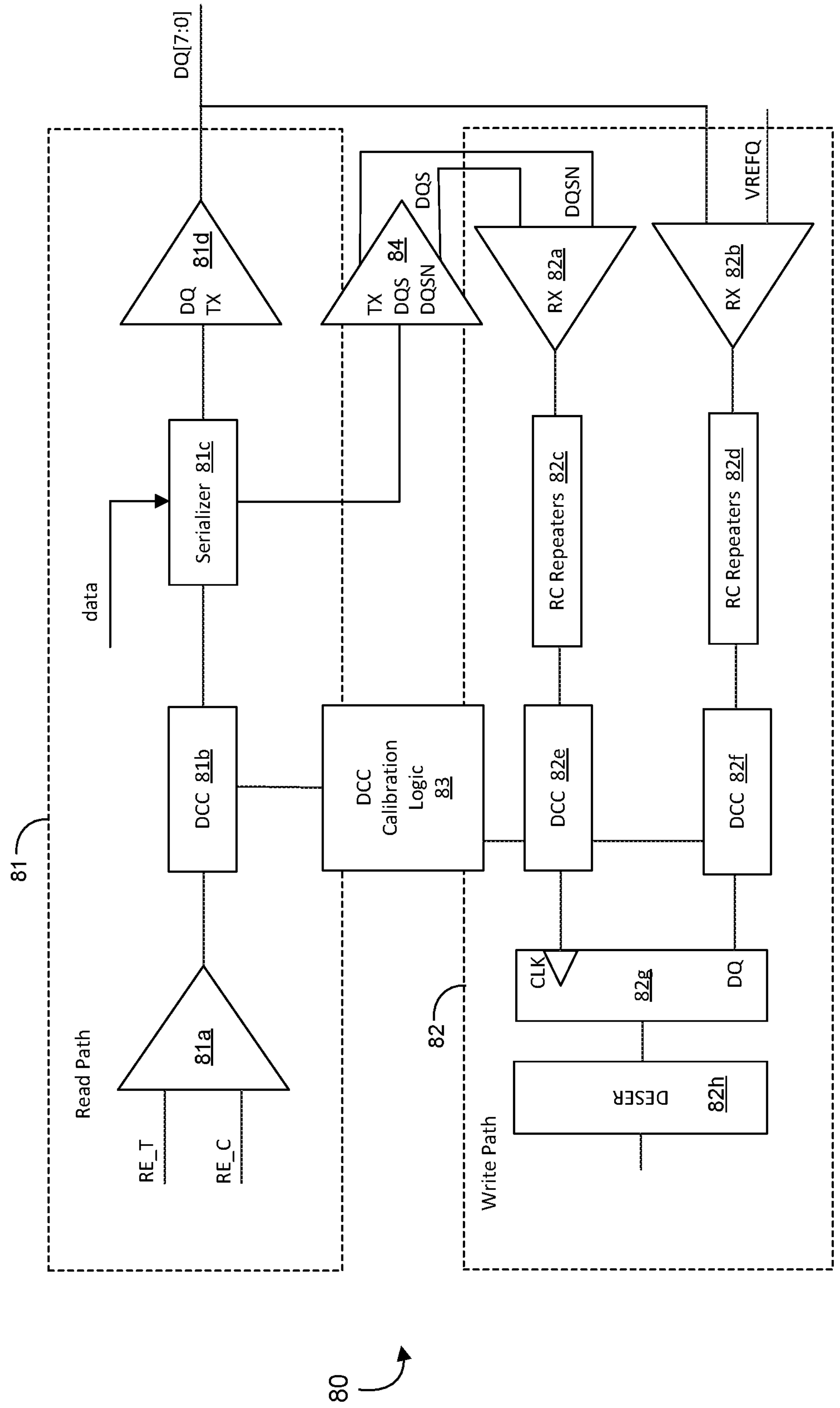
FIG. 8 is a block diagram of an interface circuit according to an example.

With reference to FIG. 8, an example of an interface circuit 80 includes a read path 81 and a write path 82. The read path 81 includes a receiver circuit 81*a*, a read DCC circuit 81*b*, a serializer circuit 81*c*, and a transmitter circuit 81*d* coupled as shown. The write path 82 includes receiver circuits 82*a*, 82*b*, resistor/capacitor (RC) repeater circuit 82*c*, 82*d*, write DCC circuits 82*e*, 82*f*, a flip flop 82*g*, and a de-serializer (DESER) circuit 82*h*, coupled as shown. The interface circuit 80 further includes DCC calibration logic 83 shared between the read DCC circuit 81*c* and the write DCC circuits 82*c*, 82*d*. The interface circuit 80 further includes a transmitter circuit 84 coupled as shown between the serializer circuit 81*c* and the receiver circuit 82*a* to provide a DQS signal and a DQS complementary (DQSN) signal to the receiver circuit 82*a*. A reference voltage signal (VREFQ) and a data signal (DQ) are provided to the receiver circuit 82*b*. The flip flop 82*g* may correspond to a first internal flip flop of the interface circuit 80 and may include a clock input (CLK) coupled to the write DCC circuit 82*e* and a data input (DQ) coupled to the write DCC circuit 82*f*.

Some systems and/or standards may specify various desired data input valid window timing (tDIVW) parameters. For example, an ONFI specification may identify tDIVW1 and tDIVW2 parameters at various clock speeds. In some examples, the interface circuit 80 may advantageously increase the data input valid window with rise and fall mismatch compensation by the write DCC circuits 82*e*, 82*f* for the data input write path 82. With data input (e.g., NAND write) DCC, some examples may improve the NAND write valid window (e.g., tDVW1/ tDVW2) specification margin for higher speeds (e.g., 1.6 GT/s and greater). With improved margin internal to NAND, some examples may reduce requirements from the system/channel needed at the input of the NAND memory device which in turn may enable higher channel speeds for the same platform/loading. As shown in FIG. 8, the DQ and DQS data input (DIN) path 82 share the duty cycle calibration logic 83 with the DOUT (RE_T/RE_C) path 81, advantageously reducing the design/area/verification effort while providing a gain in increasing the data valid window at the flip flop 82*g* and improving an input tDIVW1/tDWV2 margin.

Figure 9:
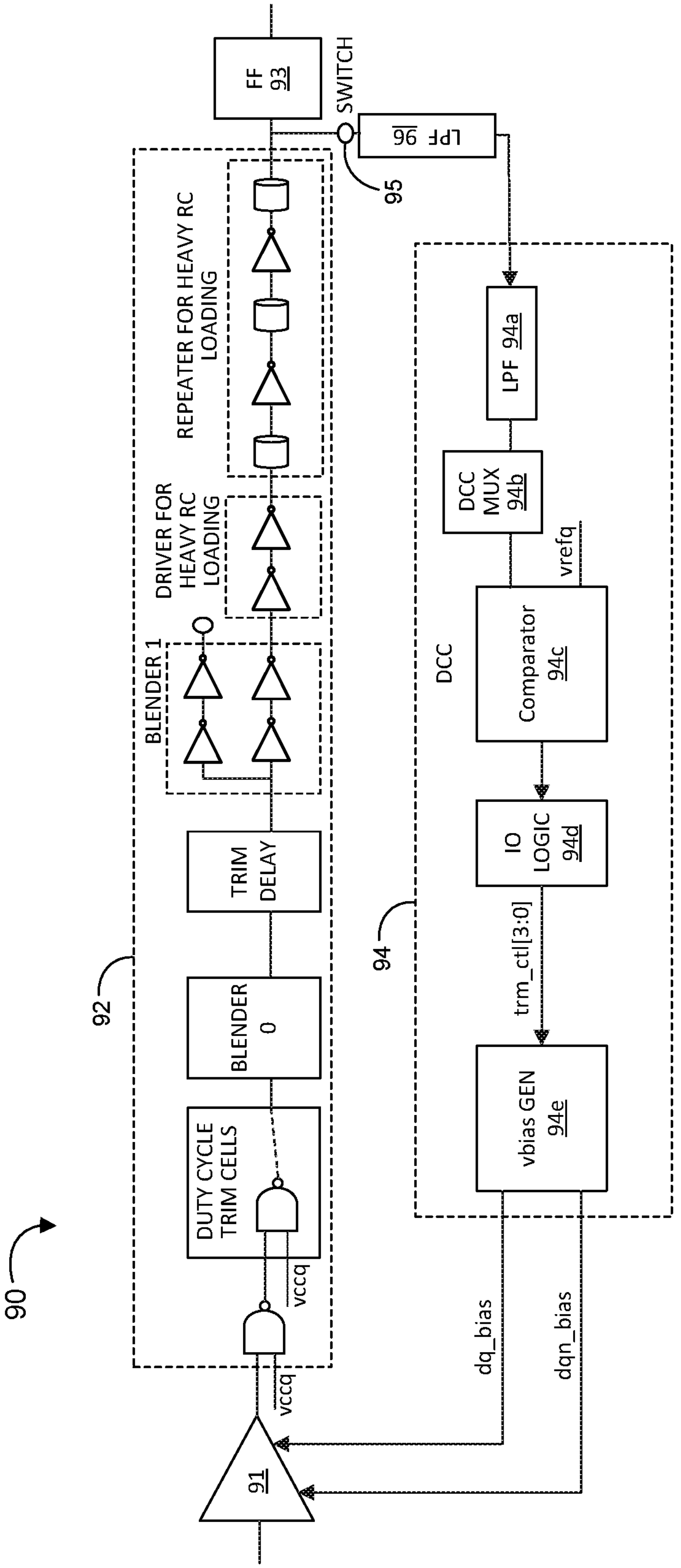
FIG. 9 is a block diagram of another interface circuit according to an example.
Figure 10A:
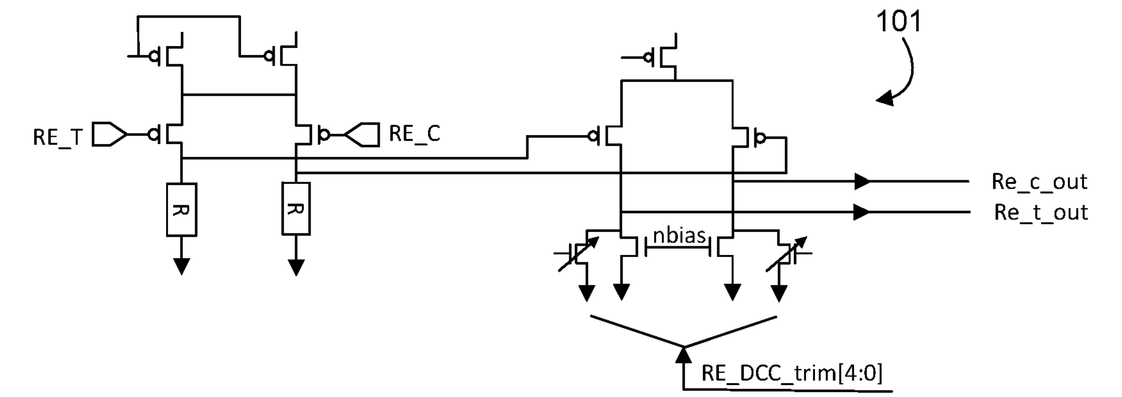
FIGS. 10A to 10D are illustrative diagrams of other examples of interface circuitry according to an example.
Figure 10B:
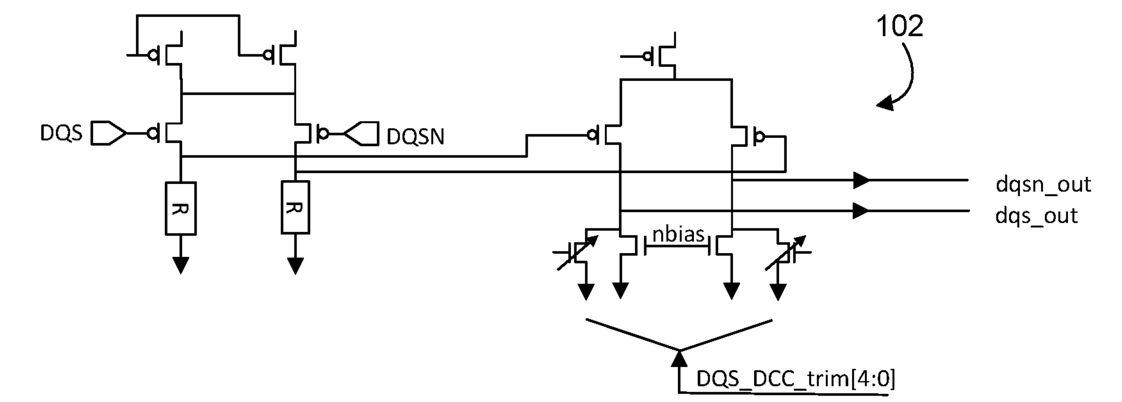
Figure 10C:
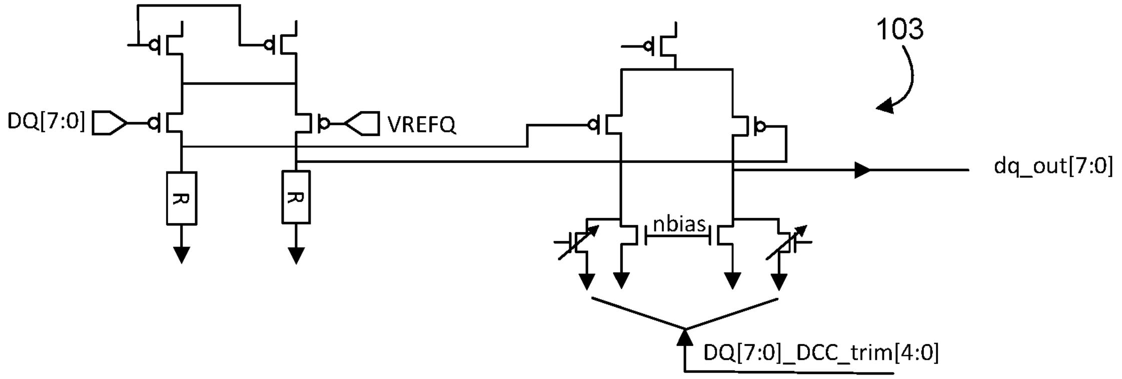
Figure 10D:
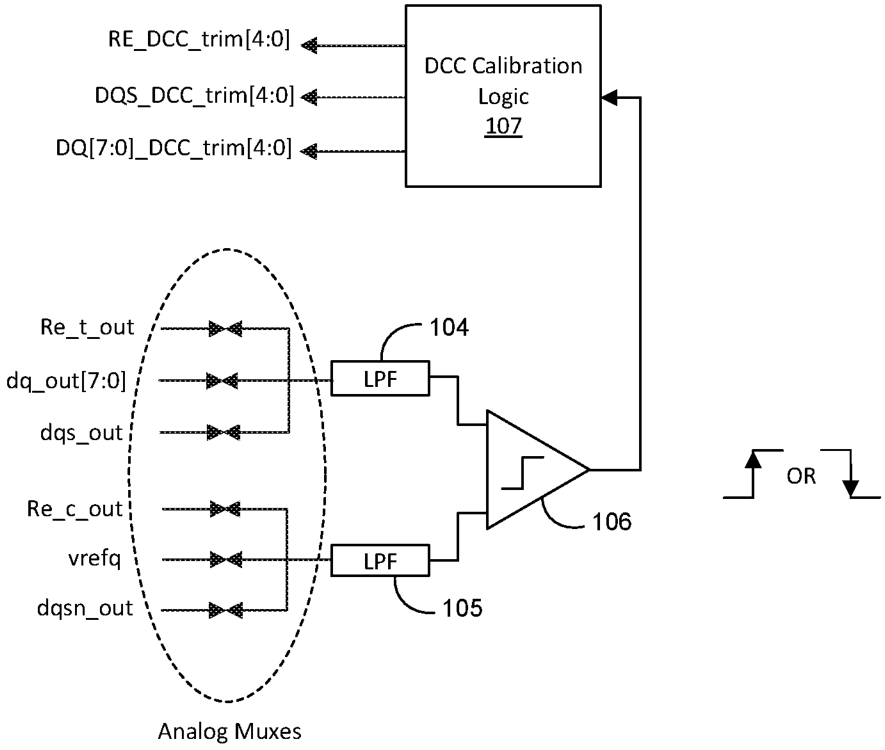

With reference to FIG. 9, an example of an interface circuit 90 may include a receiver circuit 91, a signal path circuit 92, a flip flop 93, and a DCC circuit 94 in a closed loop feedback arrangement, coupled as shown. In some examples, the flip flop 93 may be configured for setup and hold of the received input signal. The signal path circuit 92 may include any appropriate circuitry to propagate the input signal from the receiver circuit 91 to the flip flop 93. In the illustrated example, the signal path circuit 92 includes logic circuitry, trim circuitry, blender circuitry, driver circuitry, and RC repeater circuitry, coupled as shown.

The DCC circuit 94 includes a low pass filter (LPF) 94*a*, a DCC multiplexer (mux) 94*b*, a comparator 94*c*, an IO logic circuit 94*d*, and a bias voltage (vbias) generator circuit 94*e*, coupled as shown. Although shown as part of the DDC circuit 94, in some examples the IO logic circuit 94*d* may be part of DCC calibration logic shared with other DCC circuits. The LPF 94*a* filters the input signal and the comparator 94*c* compares the filtered signal against a reference signal (VREFQ) to determine if the output duty cycle is higher or lower than 50%. The IO logic circuit 94*d* takes the result signal from the comparator circuit 94*c* and provides an appropriate trim control signal (e.g., TRM_CTL[3:0]) to the vbias generator circuit 94*e*, that in turn provides appropriate bias signals (DQ_BIAS, DQN_BIAS) to the receiver circuit 91. The interface circuit 90 may further include an inline switch 95 and another LPF 96 coupled between an output of the signal path circuit 92 and the DCC circuit 94.

FIGS. 10A to 10D show example interface circuitry that includes DCC for a read path 101 and write paths 102, 103. In general, the illustrated transistor symbols with a small circle at the gate terminal may indicate PMOS transistors (e.g. MOSFETs), the illustrated transistor symbols with no circle at the gate terminal may indicate NMOS transistors, and the illustrated transistor symbols with an arrow therethrough may indicate variable transistors (e.g., a transistor utilized essentially as a variable resistor or a bleeder circuit). An example operation of the interface circuit 100 is as follows. During training a nominally ideal clock pattern (e.g., with a fifty percent (50%) duty cycle) is supplied at an input of a receiver. In a DCC calibration loop, based on signals from LPFs 104, 105 and a comparator 106, DCC calibration logic 107 determines if the output duty cycle is higher or lower than fifty percent (50%). An analog front end (AFE) then adjusts a bleeder current by skewing the input to compensate for this non-ideality (e.g., according to values of the RE_DCC_trim, DQS_DCC_trim, and DQ[7:0]_DCC_trim signals provided by the DCC calibration logic 107). For example, the DCC calibration logic 107 may walk through a set of DCC compensation codes and determine which code provides an ideal duty cycle (e.g., or a closest to ideal duty cycle, a close enough to ideal duty cycle, etc.). When the duty cycle is determined to be ideal (e.g., or within an acceptable deviation) the DCC calibration logic may lock the corresponding code for use during regular operation. The foregoing process may be repeated for all receivers (e.g., DQ, DQS and RE in this example).

The technology discussed herein may be provided in various computing systems (e.g., including a non-mobile computing device such as a desktop, workstation, server, rack system, etc., a mobile computing device such as a smartphone, tablet, Ultra-Mobile Personal Computer (UMPC), laptop computer, ULTRABOOK computing device, smart watch, smart glasses, smart bracelet, etc., and/or a client/edge device such as an Internet-of-Things (IoT) device (e.g., a sensor, a camera, etc.)).

Figure 11:
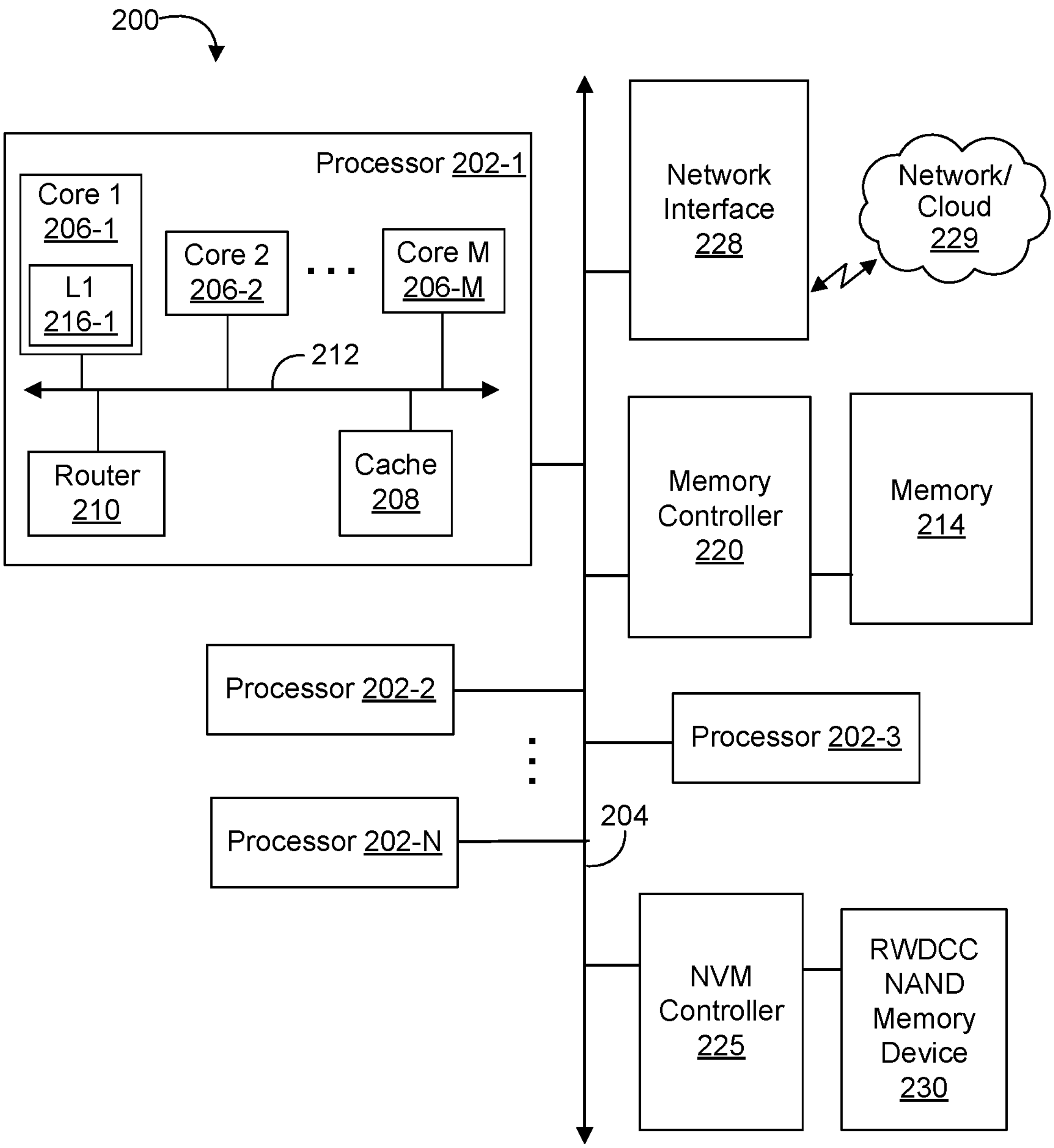
FIG. 11 is a block diagram of an example of a computing system according to an example.

Turning now to FIG. 11, an example of a computing system 200 may include one or more processors 202-1 through 202-N (generally referred to herein as "processors 202" or "processor 202"). The processors 202 may communicate via an interconnection or bus 204. Each processor 202 may include various components some of which are only discussed with reference to processor 202-1 for clarity. Accordingly, each of the remaining processors 202-2 through 202-N may include the same or similar components discussed with reference to the processor 202-1.

In some examples, the processor 202-1 may include one or more processor cores 206-1 through 206-M (referred to herein as "cores 206," or more generally as "core 206"), a cache 208 (which may be a shared cache or a private cache in various examples), and/or a router 210. The processor cores 206 may be implemented on a single integrated circuit (IC) chip. Moreover, the chip may include one or more shared and/or private caches (such as cache 208), buses or interconnections (such as a bus or interconnection 212), memory controllers, or other components.

In some examples, the router 210 may be used to communicate between various components of the processor 202-1 and/or system 200. Moreover, the processor 202-1 may include more than one router 210. Furthermore, the multitude of routers 210 may be in communication to enable data routing between various components inside or outside of the processor 202-1.

The cache 208 may store data (e.g., including instructions) that is utilized by one or more components of the processor 202-1, such as the cores 206. For example, the cache 208 may locally cache data stored in a memory 214 for faster access by the components of the processor 202. As shown in FIG. 11, the memory 214 may be in communication with the processors 202 via the interconnection 204. In some examples, the cache 208 (that may be shared) may have various levels, for example, the cache 208 may be a mid-level cache and/or a last-level cache (LLC). Also, each of the cores 206 may include a level 1 (L1) cache (32-1) (generally referred to herein as "L1 cache 32"). Various components of the processor 202-1 may communicate with the cache 208 directly, through a bus (e.g., the bus 212), and/or a memory controller or hub.

As shown in FIG. 11, memory 214 may be coupled to other components of system 200 through a memory controller 220. Memory 214 may include volatile memory and may be interchangeably referred to as main memory or system memory. Even though the memory controller 220 is shown to be coupled between the interconnection 204 and the memory 214, the memory controller 220 may be located elsewhere in system 200. For example, memory controller 220 or portions of it may be provided within one of the processors 202 in some examples. Alternatively, memory 214 may include byte-addressable non-volatile memory such as INTEL OPTANE technology.

The system 200 may communicate with other devices/systems/networks via a network interface 228 (e.g., which is in communication with a computer network and/or the cloud 229 via a wired or wireless interface). For example, the network interface 228 may include an antenna (not shown) to wirelessly (e.g., via an Institute of Electrical and Electronics Engineers (IEEE) 802.11 interface (including IEEE 802.11a/b/g/n/ac, etc.), cellular interface, 3G, 4G, LTE, BLUETOOTH, etc.) communicate with the network/cloud 229.

System 200 may also include NAND memory such as a read and write DCC (RWDCC) NAND memory device 230 coupled to the interconnect 204 via NVM controller 225. Hence, NVM controller 225 may control access by various components of system 200 to the RWDCC NAND memory device 230. Furthermore, even though NVM controller 225 is shown to be directly coupled to the interconnection 204 in FIG. 11, NVM controller 225 may alternatively communicate via a memory/storage bus/interconnect (such as the SATA (Serial Advanced Technology Attachment) bus, Peripheral Component Interconnect (PCI) (or PCI EXPRESS (PCIe) interface), NVM EXPRESS (NVMe), Serial Attached SCSI (SAS), Fiber Channel, etc.) with one or more other components of system 200 (for example where the memory bus is coupled to interconnect 204 via some other logic like a bus bridge, chipset, etc.) Additionally, NVM controller 225 may be incorporated into memory controller logic or provided on a same integrated circuit (IC) device in various examples (e.g., on the same circuit board device as the RWDCC NAND memory device 230 or in the same enclosure as the RWDCC NAND memory device 230).

Furthermore, NVM controller 225 and/or RWDCC NAND memory device 230 may be coupled to one or more sensors (not shown) to receive information (e.g., in the form of one or more bits or signals) to indicate the status of or values detected by the one or more sensors. These sensor(s) may be provided proximate to components of system 200 (or other computing systems discussed herein), including the cores 206, interconnections 204 or 212, components outside of the processor 202, RWDCC NAND memory device 230, SSD bus, SATA bus, NVM controller 225, etc., to sense variations in various factors affecting power/thermal behavior of the system/platform, such as temperature, operating frequency, operating voltage, power consumption, and/or inter-core communication activity, etc. Other high-speed IO devices in the system 200, such as the memory 214, the network interface 228, etc., may similarly incorporate one or more aspects of DCC technology for a data input path as described herein.

Figure 12:
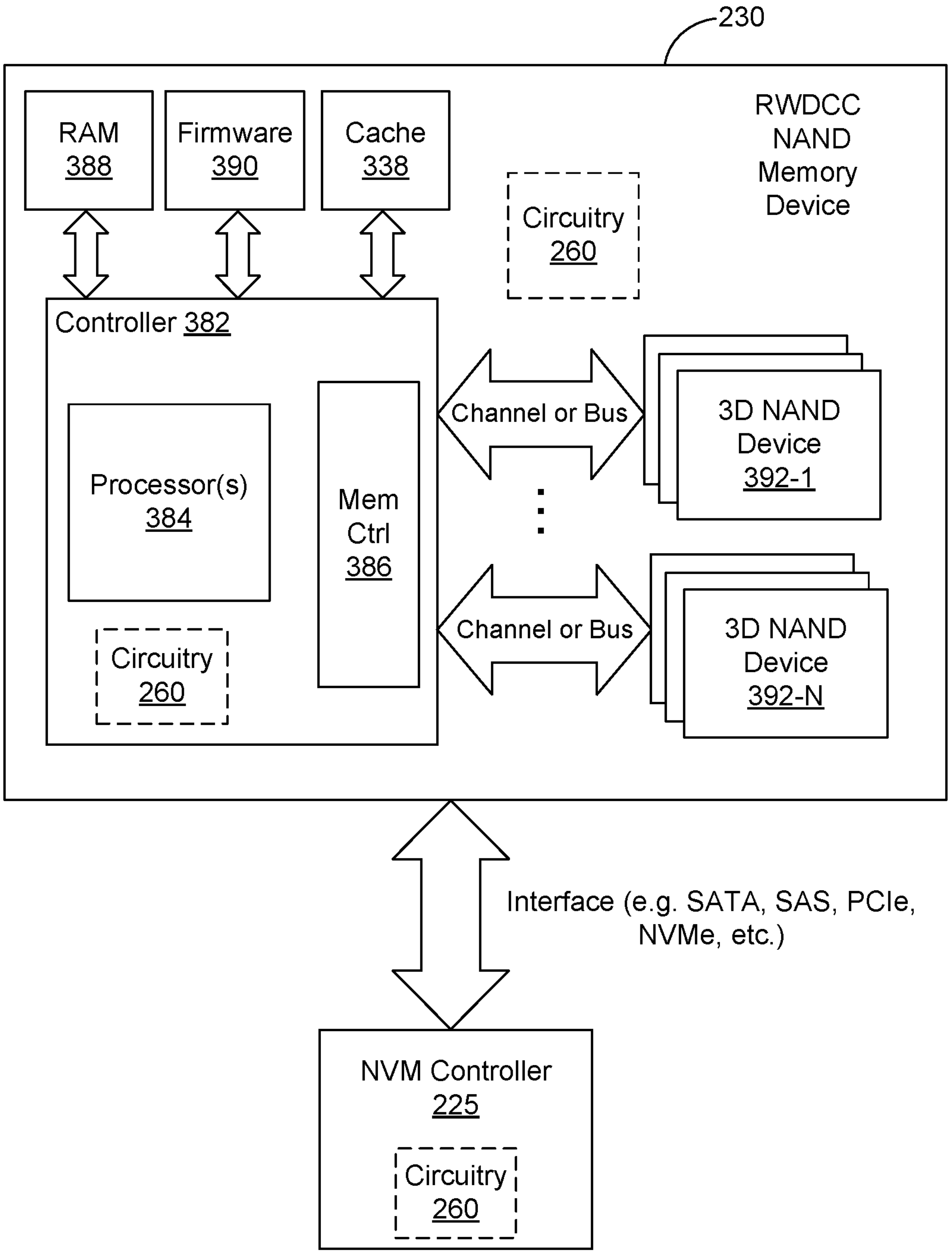
FIG. 12 is a block diagram of an example of a RWDCC NAND memory device according to an example.

FIG. 12 illustrates a block diagram of various components of the device 230, according to an example. As illustrated in FIG. 12, circuitry 260 may be located in various locations such as inside the device 230 or NVM controller 225. The device 230 includes a controller 382 (which in turn includes one or more processor cores or processors 384 and memory controller logic 386), cache 338, RAM 388, firmware storage 390, and one or more 3D NAND memory dice 392-1 to 392-N (collectively 3D NAND media 392). The 3D NAND media 392 is coupled to the memory controller logic 386 via one or more memory channels or busses. Also, device 230 communicates with NVM controller 225 via an interface (such as a SATA, SAS, PCIe, NVMe, etc., interface). Processors 384 and/or controller 382 may compress/decompress data written to or read from 3D NAND memory dice 392-1 to 392-N.

As illustrated in FIG. 12, the device 230 may include circuitry 260, which may be in the same enclosure as the device 230 and/or fully integrated on a printed circuit board (PCB) of the device 230. One or more of the features/aspects/operations discussed with reference to FIGS. 1-10D may be performed by one or more of the components of FIG. 12. Also, one or more of the features/aspects/operations of FIGS. 1-10D may be programmed into the firmware 390.

Further, NVM controller 225 may also include circuitry 260. Advantageously, the circuitry 260 may include technology to implement one or more aspects of the apparatus 10 (FIG. 1), the device 20 (FIG. 2), the device 30 (FIG. 3), the apparatus 48 (FIG. 4), the device 55 (FIG. 5), the device 64 (FIG. 6), the system 74 (FIG. 7), the interface circuit 80 (FIG. 8), the interface circuit 90 (FIG. 9), the interface circuitry (FIGS. 10A to 10D), and/or any of the features discussed herein.

For example, the controller 382 may be configured to control access to the NAND media 392, and the circuitry 260 may include read circuitry including a read DCC circuit to provide DCC for an output data read path for the device 230, and write circuitry including a write DCC circuit to provide DCC for an input data write path for the device 230. In some examples, the circuitry 260 may further include a DCC calibration engine shared between the read DCC circuit and the write DCC circuit, and training circuitry to, in response to a request from a host (e.g., a processor 202), supply a reference clock pattern at an input of the input data write path with a reference duty cycle, determine a duty cycle difference between the reference duty cycle and an output duty cycle of a signal pattern at an output of the output data write path, and adjust the write DCC circuit to compensate for the duty cycle difference based on information from the DCC calibration engine.

For example, the DCC calibration engine may be configured to provide a compensation code to the write DCC circuit based on the duty cycle difference. In some examples, the DCC calibration engine may be further configured to provide one of a first compensation code if the duty cycle difference indicates that the output duty cycle is higher than the reference duty cycle and a second compensation code if the duty cycle difference indicates that the output duty cycle is lower than the reference duty cycle. For example, the write DCC circuit may include a bleeder circuit to skew the input of the input data write path based on the compensation code. For example, the 3D NAND media 392 may include floating gate NAND memory cells, CTF NAND memory cells, etc.

Those skilled in the art will appreciate that a wide variety of devices may benefit from the foregoing examples. The following exemplary core architectures, processors, and computer architectures are non-limiting examples of devices that may beneficially incorporate examples of the technology described herein.

ADDITIONAL NOTES AND EXAMPLES

Example 1 includes an apparatus, comprising NAND memory, and circuitry coupled to the NAND memory to provide duty cycle correction (DCC) for one or more write paths of the NAND memory.

Example 2 includes the apparatus of Example 1, wherein the circuitry is further to provide closed loop DCC for one or more data input write paths of the NAND memory.

Example 3 includes the apparatus of any of Examples 1 to 2, further comprising DCC calibration logic coupled to the circuitry, wherein the circuitry is further to adjust the DCC for one or more write paths of the NAND memory based on a first signal from the DCC calibration logic.

Example 4 includes the apparatus of Example 3, wherein the circuitry is further to provide DCC for one or more read paths of the NAND memory, and adjust the DCC for one or more read paths of the NAND memory based on a second signal from the DCC calibration logic.

Example 5 includes the apparatus of any of Examples 3 to 4, wherein the DCC calibration logic is further to compare a signal pattern on a write path of the NAND memory against a reference pattern, determine a duty cycle comparison result based on the comparison, and provide a compensation code to the circuitry based on the duty cycle comparison result.

Example 6 includes the apparatus of Example 5, wherein the DCC calibration logic is further to determine if the duty cycle comparison result indicates sufficient DCC for the write path, and, if so determined, lock the compensation code for the write path.

Example 7 includes the apparatus of any of Examples 1 to 6, wherein the NAND memory comprises three-dimensional NAND memory.

Example 8 includes a memory device, comprising NAND memory, and interface circuitry coupled to the NAND memory to provide a plurality of output data read paths and a plurality of input data write paths for the NAND memory, wherein the interface circuitry further comprises a plurality of write duty cycle correction (DCC) circuits respectively coupled to the plurality of input data write paths for the NAND memory to provide DCC for the plurality of input data write paths.

Example 9 includes the memory device of Example 8, wherein the interface circuitry is further to train the plurality of write DCC circuits in response to a request from a host.

Example 10 includes the memory device of Example 9, wherein, in response to the request, the interface circuitry is further to supply a reference clock pattern at an input of a write path with a reference duty cycle, determine a duty cycle difference between the reference duty cycle and an output duty cycle of a signal pattern at an output of the write path, and adjust a corresponding write DCC circuit coupled to the write path to compensate for the duty cycle difference.

Example 11 includes the memory device of Example 10 wherein the interface circuitry further comprises DCC calibration logic coupled to the plurality of write DCC circuits to provide a compensation code to the corresponding write DCC circuit based on the duty cycle difference.

Example 12 includes the memory device of Example 11, wherein the DCC calibration logic is further to provide one of a first compensation code if the duty cycle difference indicates that the output duty cycle is higher than the reference duty cycle and a second compensation code if the duty cycle difference indicates that the output duty cycle is lower than the reference duty cycle.

Example 13 includes the memory device of any of Examples 11 to 12, wherein the corresponding write DCC circuit comprises a bleeder circuit to skew the input of the write path based on the compensation code.

Example 14 includes the memory device of any of Examples 11 to 13, wherein the interface circuitry further comprises a plurality of read DCC circuits respectively coupled to the DCC calibration logic and to the plurality of output data read paths for the NAND memory to provide DCC for the plurality of output data read paths based on respective compensation codes from the DCC calibration logic.

Example 15 includes the memory device of any of Examples 8 to 14, wherein the NAND memory comprises three-dimensional NAND memory.

Example 16 includes a system, comprising a processor, and a NAND memory device coupled to the processor, the NAND memory device comprising NAND memory cells, a controller to control access to the NAND memory cells, read circuitry including a read duty cycle correction (DCC)

circuit to provide DCC for an output data read path for the NAND memory device, and write circuitry including a write DCC circuit to provide DCC for an input data write path for the NAND memory device.

Example 17 includes the system of Example 16, wherein the NAND memory device further comprises a DCC calibration engine shared between the read DCC circuit and the write DCC circuit.

Example 18 includes the system of Example 17, wherein the NAND memory device further comprises training circuitry to, in response to a request from the processor supply a reference clock pattern at an input of the input data write path with a reference duty cycle, determine a duty cycle difference between the reference duty cycle and an output duty cycle of a signal pattern at an output of the output data write path, and adjust the write DCC circuit to compensate for the duty cycle difference based on information from the DCC calibration engine.

Example 19 includes the system of Example 18, wherein the DCC calibration engine is further to provide a compensation code to the write DCC circuit based on the duty cycle difference.

Example 20 includes the system of Example 19, wherein the DCC calibration engine is further to provide one of a first compensation code if the duty cycle difference indicates that the output duty cycle is higher than the reference duty cycle and a second compensation code if the duty cycle difference indicates that the output duty cycle is lower than the reference duty cycle.

Example 21 includes the system of any of Examples 19 to 20, wherein the write DCC circuit comprises a bleeder circuit to skew the input of the input data write path based on the compensation code.

Example 22 includes the system of any of Examples 16 to 21, wherein the NAND memory comprises three-dimensional NAND memory.

Example 23 includes the system of any of Examples 16 to 22, further comprising at least one of a display at least one of a display communicatively coupled to the processor and a battery coupled to the processor.

Example 24 includes a method, comprising controlling access to NAND memory, and providing duty cycle correction (DCC) for one or more write paths of the NAND memory.

Example 25 includes the method of Example 24, further comprising providing closed loop DCC for one or more data input write paths of the NAND memory.

Example 26 includes the method of any of Examples 24 to 25, further comprising calibrating write path duty cycle distortion (DCD) for one or more write paths of the NAND memory, and adjusting the DCC for one or more write paths of the NAND memory based on the calibrated write path DCD.

Example 27 includes the method of Example 26, further comprising providing DCC for one or more read paths of the NAND memory, calibrating read path DCD for one or more read paths of the NAND memory, and adjusting the DCC for one or more read paths of the NAND memory based on the calibrated read path DCD.

Example 28 includes the method of any of Examples 26 to 27, further comprising comparing a signal pattern on a write path of the NAND memory against a reference pattern, determining a duty cycle comparison result based on the comparison, and providing a compensation code based on the duty cycle comparison result.

Example 29 includes the method of Example 28, further comprising determining if the duty cycle comparison result indicates sufficient DCC for the write path, and, if so determined, locking the compensation code for the write path.

Example 30 includes the method of any of Examples 24 to 29, wherein the NAND memory comprises three-dimensional NAND memory.

Example 31 includes an apparatus, comprising means for controlling access to NAND memory, and means for providing duty cycle correction (DCC) for one or more write paths of the NAND memory.

Example 32 includes the apparatus of Example 31, further comprising means for provide closed loop DCC for one or more data input write paths of the NAND memory.

Example 33 includes the apparatus of any of Examples 31 to 32, further comprising means for calibrating write path duty cycle distortion (DCD) for one or more write paths of the NAND memory, and means for adjusting the DCC for one or more write paths of the NAND memory based on the calibrated write path DCD.

Example 34 includes the apparatus of Example 33, further comprising means for providing DCC for one or more read paths of the NAND memory, means for calibrating read path DCD for one or more read paths of the NAND memory, and means for adjusting the DCC for one or more read paths of the NAND memory based on the calibrated read path DCD.

Example 35 includes the apparatus of any of Examples 33 to 34, further comprising means for comparing a signal pattern on a write path of the NAND memory against a reference pattern, means for determining a duty cycle comparison result based on the comparison, and means for providing a compensation code based on the duty cycle comparison result.

Example 36 includes the apparatus of Example 35, further comprising means for determining if the duty cycle comparison result indicates sufficient DCC for the write path, and, if so determined, means for locking the compensation code for the write path.

Example 37 includes the apparatus of any of Examples 31 to 36, wherein the NAND memory comprises three-dimensional NAND memory.

Example 38 includes at least one non-transitory one machine readable medium comprising a plurality of instructions that, in response to being executed on a computing device, cause the computing device to control access to NAND memory, and provide duty cycle correction (DCC) for one or more write paths of the NAND memory.

Example 39 includes the at least one non-transitory one machine readable medium of Example 38, comprising a plurality of further instructions that, in response to being executed on the computing device, cause the computing device to provide closed loop DCC for one or more data input write paths of the NAND memory.

Example 40 includes the at least one non-transitory one machine readable medium of any of Examples 38 to 39, comprising a plurality of further instructions that, in response to being executed on the computing device, cause the computing device to calibrate write path duty cycle distortion (DCD) for one or more write paths of the NAND memory, and adjust the DCC for one or more write paths of the NAND memory based on the calibrated write path DCD.

Example 41 includes the at least one non-transitory one machine readable medium of Example 40, comprising a plurality of further instructions that, in response to being executed on the computing device, cause the computing device to provide DCC for one or more read paths of the NAND memory, calibrate read path DCD for one or more read paths of the NAND memory, and adjust the DCC for one or more read paths of the NAND memory based on the calibrated read path DCD.

Example 42 includes the at least one non-transitory one machine readable medium of any of Examples 40 to 41, comprising a plurality of further instructions that, in response to being executed on the computing device, cause the computing device to compare a signal pattern on a write path of the NAND memory against a reference pattern, determine a duty cycle comparison result based on the comparison, and provide a compensation code based on the duty cycle comparison result.

Example 43 includes the at least one non-transitory one machine readable medium of Example 42, comprising a plurality of further instructions that, in response to being executed on the computing device, cause the computing device to determine if the duty cycle comparison result indicates sufficient DCC for the write path, and, if so determined, lock the compensation code for the write path.

Example 44 includes the at least one non-transitory one machine readable medium of any of Examples 38 to 43, wherein the NAND memory comprises three-dimensional NAND memory.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C. Various components of the systems described herein may be implemented in software, firmware, and/or hardware and/or any combination thereof. For example, various components of the systems or devices discussed herein may be provided, at least in part, by hardware of a computing SoC such as may be found in a computing system such as, for example, a smart phone. Those skilled in the art may recognize that systems described herein may include additional components that have not been depicted in the corresponding figures. For example, the systems discussed herein may include additional components such as bit stream multiplexer or de-multiplexer modules and the like that have not been depicted in the interest of clarity.

While implementation of the example processes discussed herein may include the undertaking of all operations shown in the order illustrated, the present disclosure is not limited in this regard and, in various examples, implementation of the example processes herein may include only a subset of the operations shown, operations performed in a different order than illustrated, or additional operations.

In addition, any one or more of the operations discussed herein may be undertaken in response to instructions provided by one or more computer program products. Such program products may include signal bearing media providing instructions that, when executed by, for example, a processor, may provide the functionality described herein. The computer program products may be provided in any form of one or more machine-readable media. Thus, for example, a processor including one or more graphics processing unit(s) or processor core(s) may undertake one or more of the blocks of the example processes herein in response to program code and/or instructions or instruction sets conveyed to the processor by one or more machine-readable media. In general, a machine-readable medium may convey software in the form of program code and/or instructions or instruction sets that may cause any of the devices and/or systems described herein to implement at least portions of the operations discussed herein and/or any portions the devices, systems, or any module or component as discussed herein.

As used in any implementation described herein, the term "module" refers to any combination of software logic, firmware logic, hardware logic, and/or circuitry configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, fixed function circuitry, execution unit circuitry, and/or firmware that stores instructions executed by programmable circuitry. The modules may, collectively or individually, be embodied as circuitry that forms part of a larger system, for example, an integrated circuit (IC), system on-chip (SoC), and so forth.

Various examples may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one example may be implemented by representative instructions stored on a machine-readable medium which represents various logic within the processor, which when read by a machine causes the machine to fabricate logic to perform the techniques described herein. Such representations, known as IP cores may be stored on a tangible, machine readable medium and supplied to various customers or manufacturing facilities to load into the fabrication machines that actually make the logic or processor.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the examples are not limited to the examples so described, but may be practiced with modification and alteration without departing from the scope of the appended claims. For example, the above examples may include specific combination of features. However, the above examples are not limited in this regard and, in various implementations, the above examples may include the undertaking only a subset of such features, undertaking a different order of such features, undertaking a different combination of such features, and/or undertaking additional features than those features explicitly listed. The scope of the examples should, therefore, be determined with reference to the appended claims, along with the full scope of equivalents to which such claims are entitled.

What is claimed is:

1. An apparatus, comprising:
NAND memory; and
correction circuitry coupled to the NAND memory to provide duty cycle correction (DCC) for one or more write paths of the NAND memory, wherein the correction circuit further includes:
a filter coupled to a first write path of the NAND memory and configured to convert an output of the first write path to a filtered signal;
a comparator coupled to the filter and configured to compare the filtered signal with a reference signal to generate a comparison result; and
a bias generator coupled to the comparator and configured to determine a bias signal based on the comparison result and provide the bias signal to the first write path to control the output of the first write path.

2. The apparatus of claim 1, wherein the correction circuitry is further to:
provide closed loop DCC for the one or more write paths of the NAND memory.

3. The apparatus of claim 1, further comprising DCC calibration logic coupled to the correction circuitry, wherein the correction circuitry is further to:
adjust the DCC for the one or more write paths of the NAND memory based on a first signal from the DCC calibration logic.

4. The apparatus of claim 3, wherein the correction circuitry is further to:
provide DCC for the one or more read paths of the NAND memory; and
adjust the DCC for one or more read paths of the NAND memory based on a second signal from the DCC calibration logic.

5. The apparatus of claim 3, wherein the DCC calibration logic is further to:
compare a signal pattern on a second write path of the NAND memory against a reference pattern;
determine a duty cycle comparison result based on the comparison; and
provide a compensation code to the correction circuitry based on the duty cycle comparison result.

6. The apparatus of claim 5, wherein the DCC calibration logic is further to:
determine if the duty cycle comparison result indicates sufficient DCC for the second write path; and
if so determined, lock the compensation code for the second write path.

7. The apparatus of claim 1, wherein the NAND memory comprises three-dimensional NAND memory.

8. A memory device, comprising:
NAND memory; and
interface circuitry coupled to the NAND memory to provide a plurality of output data read paths and a plurality of input data write paths for the NAND memory, wherein the interface circuitry further comprises a plurality of write duty cycle correction (DCC) circuits respectively coupled to the plurality of input data write paths for the NAND memory to provide DCC for the plurality of input data write paths, wherein the plurality of write DCC circuits includes a first write DCC circuit, which further includes:
a filter coupled to a first input data write path of the NAND memory and configured to convert an output of the first input data write path to a filtered signal;
a comparator coupled to the filter and configured to compare the filtered signal with a reference signal to generate a comparison result; and
a bias generator coupled to the comparator and configured to determine a bias signal based on the comparison result and provide the bias signal to the first input data write path to control the output of the first input data write path.

9. The memory device of claim 8, wherein the interface circuitry is further to: train the plurality of write DCC circuits in response to a request from a host.

10. The memory device of claim 9, wherein, in response to the request, the interface circuitry is further to:
supply a reference clock pattern at an input of a second input data write path with a reference duty cycle;
determine a duty cycle difference between the reference duty cycle and an output duty cycle of a signal pattern at an output of the second input data write path; and
adjust a corresponding write DCC circuit coupled to the second input data write path to compensate for the duty cycle difference.

11. The memory device of claim 10 wherein the interface circuitry further comprises: DCC calibration logic coupled to the plurality of write DCC circuits to provide a compensation code to the corresponding write DCC circuit based on the duty cycle difference.

12. The memory device of claim 11, wherein the DCC calibration logic is further to:
provide one of a first compensation code if the duty cycle difference indicates that the output duty cycle is higher than the reference duty cycle and a second compensation code if the duty cycle difference indicates that the output duty cycle is lower than the reference duty cycle.

13. The memory device of claim 11, wherein the corresponding write DCC circuit comprises: a bleeder circuit to skew the input of the second input data write path based on the compensation code.

14. The memory device of claim 11, wherein the interface circuitry further comprises:
a plurality of read DCC circuits respectively coupled to the DCC calibration logic and to the plurality of output data read paths for the NAND memory to provide DCC for the plurality of output data read paths based on respective compensation codes from the DCC calibration logic.

15. A system, comprising:
a processor; and
a NAND memory device coupled to the processor, the NAND memory device comprising:
NAND memory cells;
a controller to control access to the NAND memory cells;
read circuitry including a read duty cycle correction (DCC) circuit to provide DCC for an output data read path for the NAND memory device; and write circuitry including a write DCC circuit to provide DCC for an input data write path for the NAND memory device, wherein the write DCC circuit includes:

a filter coupled to the input data write path of the NAND memory device and configured to convert an output of the input data write path to a filtered signal;

a comparator coupled to the filter and configured to compare the filtered signal with a reference signal to generate a comparison result; and a bias generator coupled to the comparator and configured to determine a bias signal based on the comparison result and provide the bias signal to the input data write path to control the output of the input data write path.

16. The system of claim 15, wherein the NAND memory device further comprises: a DCC calibration engine shared between the read DCC circuit and the write DCC circuit.

17. The system of claim 16, wherein the NAND memory device further comprises training circuitry to, in response to a request from the processor:

supply a reference clock pattern at an input of the input data write path with a reference duty cycle;

determine a duty cycle difference between the reference duty cycle and an output duty cycle of a signal pattern at an output of the input data write path; and adjust the write DCC circuit to compensate for the duty cycle difference based on information from the DCC calibration engine.

18. The system of claim 17, wherein the DCC calibration engine is further to:

provide a compensation code to the write DCC circuit based on the duty cycle difference.

19. The system of claim 18, wherein the DCC calibration engine is further to:

provide one of a first compensation code if the duty cycle difference indicates that the output duty cycle is higher than the reference duty cycle and a second compensation code if the duty cycle difference indicates that the output duty cycle is lower than the reference duty cycle.

20. The system of claim 18, wherein the write DCC circuit comprises:

a bleeder circuit to skew the input of the input data write path based on the compensation code.

* * * * *